United States Patent
Xu

(10) Patent No.: US 10,479,914 B2
(45) Date of Patent: Nov. 19, 2019

(54) CONDUCTIVE PARTICLE AND PREPARATION METHOD THEREOF, CONDUCTIVE ADHESIVE AND DISPLAY DEVICE

(71) Applicants: BOE TECHNOLOGY GROUP CO., LTD., Beijing (CN); HEFEI BOE OPTOELECTRONICS TECHNOLOGY CO., LTD., Anhui (CN)

(72) Inventor: Dezhi Xu, Beijing (CN)

(73) Assignees: BOE TECHNOLOGY GROUP CO., LTD., Beijing (CN); HEFEI BOE OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 73 days.

(21) Appl. No.: 15/141,451

(22) Filed: Apr. 28, 2016

(65) Prior Publication Data
US 2017/0088752 A1  Mar. 30, 2017

(30) Foreign Application Priority Data
Sep. 25, 2015  (CN) .......................... 2015 1 0623840

(51) Int. Cl.
| | |
|---|---|
| C09J 9/02 | (2006.01) |
| C09J 1/00 | (2006.01) |
| H01L 23/00 | (2006.01) |
| C09J 11/08 | (2006.01) |
| C08K 9/00 | (2006.01) |

(52) U.S. Cl.
CPC . *C09J 9/02* (2013.01); *C09J 1/00* (2013.01); *C09J 11/08* (2013.01); *H01L 24/29* (2013.01); *C08K 9/00* (2013.01); *C08K 2201/001* (2013.01); *H01L 2224/29005* (2013.01); *H01L 2224/29099* (2013.01); *H01L 2224/29693* (2013.01)

(58) Field of Classification Search
None
See application file for complete search history.

(56) References Cited

U.S. PATENT DOCUMENTS

| | | | | |
|---|---|---|---|---|
| 5,958,302 A | * | 9/1999 | Cunningham | ........ C08F 292/00 |
| | | | | 252/500 |
| 2008/0166474 A1 | | 7/2008 | Deguchi et al. | |
| 2011/0300447 A1 | * | 12/2011 | Archer | ................... B82Y 30/00 |
| | | | | 429/231.8 |

FOREIGN PATENT DOCUMENTS

| | | | |
|---|---|---|---|
| CN | 1477058 | A | 2/2004 |
| CN | 101053827 | A | 10/2007 |
| CN | 103788278 | * | 5/2014 |
| CN | 104130735 | A | 11/2014 |
| KR | 20100138607 | A | * 12/2010 |

OTHER PUBLICATIONS

Zhou et al. Hollow nitrogen containing core/shell fibrous carbon nanomaterials as support to platinum nanocatalysts and their TEM tomography study. Nanoscale Research Letters, 2012, 7:165 (Year: 2012).*
Tang et al. Measurement of ionizing radiation using carbon nanotube field effect transistor. Phys. Med. Biology. 50 (2005) N23-N31 (Year: 2005).*
Cress et al. Radiation Effects in Carbon Nanoelectronics. Electronics, 2012, 1, 23-31 (Year: 2012).*
Wang et al. Constructing Fe3O4@N-rich Carbon Core-Shell Microspheres as Anode for Lithium Ion Batteries with Enhanced Electrochemical Performance. Electrochemical Acta 130 (2014) 679-688 (Year: 2014).*
Tang et al. Nanoporous Carbon Films from "Hairy" Polyacrylonitrile-Grafted Colloidal Silica Nanoparticles. Adv. Mater. 2008, 20, 1516-1522 (Year: 2008).*
Vowinskel et al. 3D-ordered carbon materials by melt-shear organization for tailor-made hybrid core-shell polymer particle architectures. J. Mater. Chem, C, 2016, 4, 3976-3986 (Year: 2015).*
Second Office Action for Chinese Application No. 201510623840.8, dated Mar. 8, 2017, 10 Pages.
James E. Morris, Nanopackaging, Nanotechnologies and Electronics Packaging, China Machine Press, dated Nov. 2012, 5 pages.
"Polymer Material Radiation Processing Technology and Application," Gaofenzi Cailiao Fushe Jiagong Jishu Ji Yingyong.
Liu Si et al., "Synthesis and characterization of SiO2 particles by sol-gel method," Journal of Jiangsu University of Science and Technology (Natural Science Edition), vol. 28, No. 3, Jun. 2014.
Office Action in Chinese Patent Application No. 201510623840.8, dated Sep. 2, 2016.

* cited by examiner

*Primary Examiner* — Tanisha Diggs
(74) *Attorney, Agent, or Firm* — Brooks Kushman P.C.

(57) ABSTRACT

The present disclosure provides a conductive particle and a preparation method thereof, a conductive adhesive and a display device. The preparation method comprises steps of: forming cores; dispersing the spherical cores in deionized water and adding organic polymeric monomers so as to form a reaction solution; radiating the reaction solution with γ rays so that the organic polymeric monomers are polymerized on surfaces of the cores so as to form organic polymers; separating the spherical cores formed with the organic polymers on their surfaces from the reaction solution so as to obtain them; successively carrying out preoxidation and carbonization treatment on the cores formed with the organic polymers on their surfaces so that the organic polymers form a conductive layer consisting of carbon particles so as to obtain conductive particles each consisting of the conductive layer and the core.

5 Claims, 5 Drawing Sheets

| PS spherical core | styrene (g) | acrylic acid (g) | potassium persulfate (g) | deionized water (g) |
|---|---|---|---|---|
| PS spherical core 1 | 10 | 0.6 | 0.05 | 10 |
| PS spherical core 2 | 10 | 0.8 | 0.05 | 10 |
| PS spherical core 3 | 10 | 1.0 | 0.05 | 10 |
Fig. 4
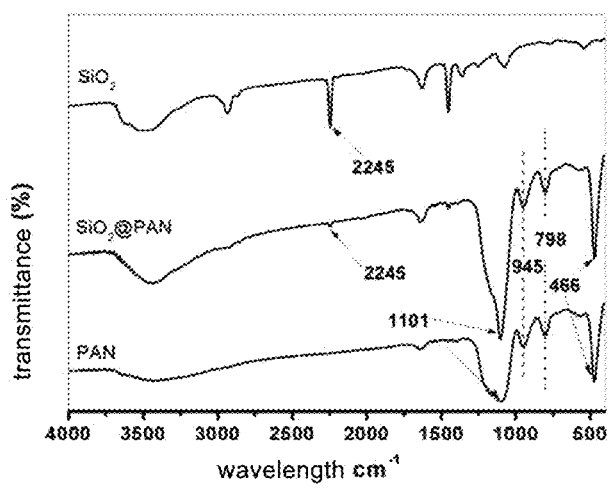
Fig. 5
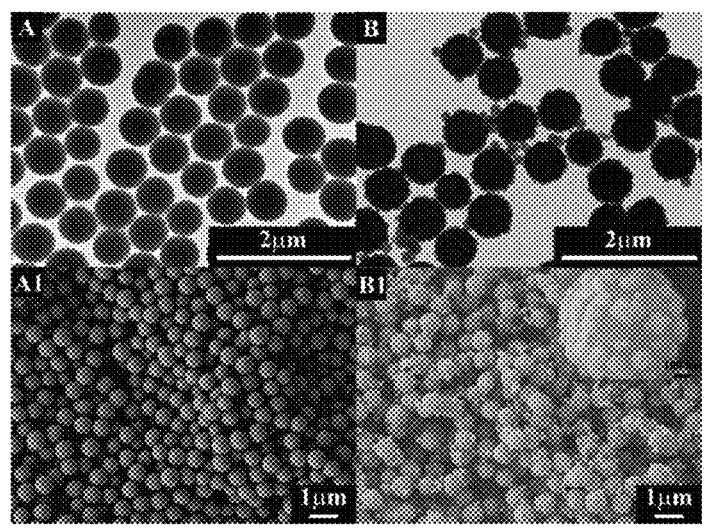
Fig. 6

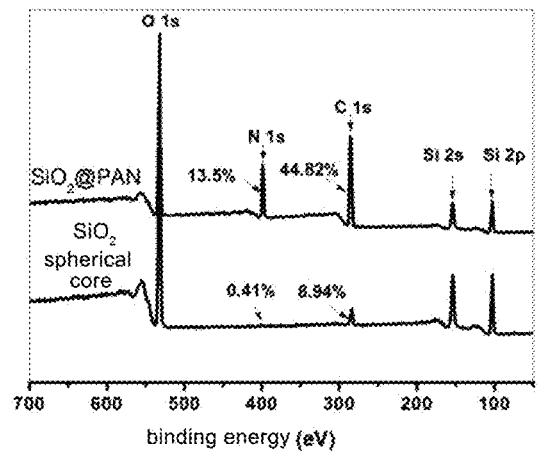
Fig. 7
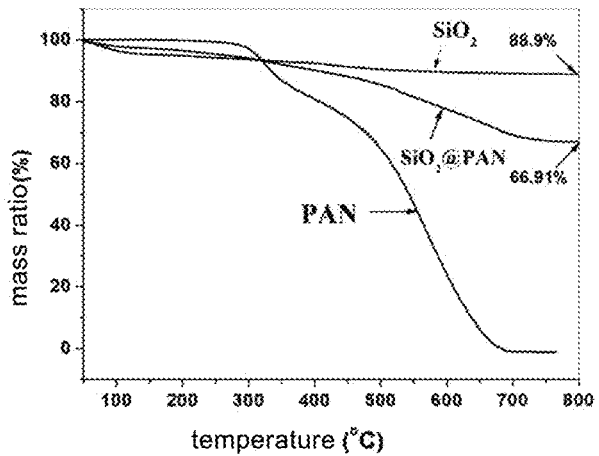
Fig. 8
| sample | SiO$_2$ (g) | AN (g) | W$_{AN/SiO2}$ (w/w) | deionized water (g) |
|---|---|---|---|---|
| A | 0.10 | 0.025 | 0.25 | 10 |
| B | 0.10 | 0.05 | 0.50 | 10 |
| C | 0.10 | 0.10 | 1.00 | 10 |
| D | 0.10 | 0.20 | 2.00 | 10 |
| E | 0.10 | 0.40 | 4.00 | 10 |
| F | 0.10 | 0.80 | 8.00 | 10 |
Fig. 9

CONDUCTIVE PARTICLE AND PREPARATION METHOD THEREOF, CONDUCTIVE ADHESIVE AND DISPLAY DEVICE

CROSS-REFERENCE TO RELATED APPLICATION

The present application claims priority to the Chinese patent Application No. 201510623840.8 filed in China on Sep. 25, 2015, the entire contents of which are incorporated by reference.

TECHNICAL FIELD

The present disclosure relates to the field of display technology, and in particular to a conductive particle and a preparation method thereof, a conductive adhesive and a display device.

BACKGROUND

A conductive adhesive, which is an adhesive having both electrical conductivity and bonding performance, can connect various conductive materials or conductive elements together so as to form conductive paths between the connected conductive materials or conductive elements. A conductive adhesive is widely used in the field of manufacturing electronic devices. A conductive adhesive is usually composed of two parts, that is, a mainbody glue material having a binding property and a conductive filler.

In the conductive adhesive, the conductive filler mainly comprises three major categories of materials, i.e., metal oxides, metals, carbon-based materials. Since metal oxides generally have poor electrical conductivity, metals or carbon-based materials are usually used as the conductive filler. Metallic conductive fillers are usually particles of a metal having a relatively low electrical resistivity selected from Au (gold), Ag (silver), Cu (copper), Ni (nickel), etc. Due to having excellent electrical conductivity and chemical stability, Au or Ag particles are more suitable for the conductive adhesive as the conductive fillers than Cu and Ni particles. However, due to high price, use of Au or Ag will cause a sharp increase in the cost of the manufacture of electronic devices, which is not good for large-scale production. The carbon-based materials such as carbon black also have good electrical conductivity and a relatively low price, and thus use of the carbon-based materials can achieve a cheap conductive adhesive and large-scale production.

However, it is very difficult to homogeneously fine carbon-based materials and well disperse them in a mainbody glue material. Therefore, there is a problem that processing is difficult with use of the carbon-based material as the conductive filler in the conductive adhesive. Moreover, the electrical conductivity of the carbon-based material varies greatly with producing areas of raw materials and other factors, and processing repeatability of them is poor.

SUMMARY

In order to solve the problems existing in the prior art, the present disclosure provide a conductive particle and a preparation method thereof, a conductive adhesive and a display device. Through the preparation method of the conductive particle, the problems that processing is difficult with use of the carbon-based material as the conductive filler in the conductive adhesive and conductivity varies greatly with producing areas of raw materials and other factors in the prior art can be solved.

In order to achieve this object, the present disclosure adopts the following technical solutions.

According to one aspect of the present disclosure, the present disclosure provides a method of preparing a conductive particle, comprising: forming cores; dispersing the cores in deionized water and adding organic polymeric monomers so as to form a reaction solution; radiating the reaction solution with γ rays so that the organic polymeric monomers are polymerized on surfaces of the cores so as to form organic polymers; separating the cores from the reaction solution so as to obtain the cores formed with the organic polymers on their surfaces; successively carrying out preoxidation and carbonization treatment on the cores formed with the organic polymers on their surfaces so that the organic polymers form a conductive layer consisting of carbon particles, so as to obtain the conductive particles each consisting of the conductive layer and the core.

Optionally, the cores are spherical cores.

Optionally, the step of forming spherical cores comprises: forming the spherical cores using a process selected from the group consisting of a sol-gel process, a process of emulsion polymerization, a microemulsion process, a hydrothermal process and a microwave hydrothermal process.

According to one embodiment of the present disclosure, silica spherical cores are formed using the sol-gel process.

Optionally, the step of forming silica spherical cores using the sol-gel process comprises: adding aqueous ammonia to a mixed solution of ethanol and water so as to form an original reaction solution; adding tetraethylorthosilicate to the original reaction solution to carry out a reaction so as to form silica spherical cores; and separating, washing and drying the formed silica spherical cores successively.

Optionally, prior to the step of radiating the reaction solution with γ rays, the method further comprises introducing a nitrogen gas into the reaction solution so as to remove dissolved oxygen from the reaction solution.

Optionally, the organic polymeric monomer is one or more monomer(s) selected from the group consisting of acrylonitrile, 2,3-dimethyl acrylonitrile, 3-phenyl-2-acrylonitrile, and 2-methoxymethyl-3-methoxy acrylonitrile.

Optionally, a mass ratio of the organic polymeric monomers to the spherical cores is in the range from 0.25:1 to 8:1.

Optionally, the step of successively carrying out preoxidation and carbonization treatment on the spherical cores formed with the organic polymers on their surfaces so as to obtain conductive particles each consisting of the conductive layer and the spherical core coated with the conductive layer comprises: placing the spherical cores formed with the organic polymers on their surfaces in a heating vessel, and heating the spherical cores formed with the organic polymers on their surfaces in the presence of air so as to subject the organic polymers to preoxidation treatment; introducing an inert gas into the heating vessel and heating the spherical cores formed with the organic polymers on their surfaces so as to subject the organic polymers to carbonization treatment; and after the heating vessel has cooled down, obtaining the conductive particles each consisting of the conductive layer and the spherical core coated with the conductive layer.

According to another aspect of the present disclosure, the present disclosure further provides a conductive particle which comprises a conductive layer consisting of carbon particles and cores coated with the conductive layer.

Optionally, the carbon particle comprises one or more of carbon black, graphite, graphene and carbon nanotubes.

Optionally, the core is a spherical core, and made of one ore more of silica, aluminum oxide, polystyrene and resin.

Optionally, the conductive particle has a particle size ranging from 0.1 to 5.0 micrometer, and further ranging from 0.5 to 1.0 micrometer.

According to another aspect of the present disclosure, the present disclosure provides a conductive adhesive which comprises: a mainbody glue material and the conductive particles as described above.

According to further another aspect the present disclosure, the present disclosure provides a display device which comprises the conductive adhesive as described above for connecting conductive structures.

In the conductive particle obtained using the method provided by the embodiment of the present disclosure, the carbon particles constituting the conductive layer are not obtained by direct dispersion of a carbon-based material, but obtained by forming uniformly-distributed organic polymers on the surface of the spherical cores through polymerization with γ-ray radiation and then subjecting the organic polymers to the preoxidization and carbonization treatment. Thus, the carbon particles are distributed uniformly in the conductive layer and have a large specific surface area, which overcomes the defects in the prior art that the carbon-based materials as conductive fillers are hard to be uniformly crushed and dispersed. Moreover, the conductive layer is obtained by preoxidization and carbonization of the organic polymers, which facilitates the improvement and stabilization of the electrical conductivity of the carbon particles. Thus, the conductive particle obtained using the method provided by the embodiment of the present disclosure can solve the problems in the traditional methods that processing is difficult with carbon-based materials used as conductive fillers and conductivity varies greatly with producing areas of carbon-based raw materials and other factors. In addition, the carbon particles adopt the spherical cores or nearly spherical cores as a carrier, which is beneficial to improving dispersibility of the conductive particles in the mainbody glue material of the conductive adhesive and avoids the occurrence of aggregation which easily takes place when the carbon-based materials are directly dispersed in the mainbody glue material in the prior art.

BRIEF DESCRIPTION OF THE DRAWINGS

In order to explain technical solutions of the embodiments of the present disclosure or those in the prior art more clearly, the drawings needed to be used in the description of the embodiments or the prior art will be briefly introduced below. Obviously, the drawings described below merely represent some embodiments of the present disclosure, and for a person having ordinary skills in the art, other drawings can be further obtained according to these drawings without exercising any inventive skills.

FIG. 4 shows ratios of reactants for preparing PS spherical cores provided in an embodiment of the present disclosure;

FIG. 5 shows comparison of FTIR spectra of $SiO_2$@PAN composite microspheres and $SiO_2$ sphere cores obtained in one embodiment of the present disclosure, and PAN;

FIG. 6 shows comparison of SEM images of $SiO_2$@PAN composite microspheres and $SiO_2$ spherical cores obtained in one embodiment of the present disclosure;

FIG. 7 shows comparison of XPS energy spectra of $SiO_2$@PAN composite microspheres and $SiO_2$ spherical cores obtained in one embodiment of the present disclosure;

FIG. 8 shows comparison of TGA curves of $SiO_2$@PAN composite microspheres and $SiO_2$ spherical cores obtained in one embodiment of the present disclosure;

FIG. 9 shows ratios of AN to $SiO_2$ for preparing $SiO_2$@PAN composite microspheres provided in an embodiment of the present disclosure;

The FTIR spectrogram refers to an infrared absorption spectrogram for qualitative and quantitative detection of a sample obtained by processing signals generated after interference light passing through the sample based on Fourier transform using Fourier Transform Infrared Spectrometer.

The SEM image is a sample's surface topography image obtained using Scanning Electron Microscope based on the principle of secondary electron signal imaging.

The XPS energy spectrogram is a spectrum containing information such as the molecular structure, valence states of atoms, chemical bonds and elemental composition and contents, obtained using X-ray Photoelectron Spectroscopy;

The TGA curve is a curve containing information such as thermal stability and a composition of a material obtained using Thermo gravimetric Analysis.

The TEM image is an image of ultra-microstructures of the surface and interior of a sample obtained using Transmission Electron Microscope based on the principle of generating solid angle scattering at different angles by projecting a beam of electrons onto the sample.

DETAILED DESCRIPTION

Technical solutions of the embodiments of the present disclosure will be described below in a clear and complete manner in combination with the drawings. Apparently, the embodiments described are merely a part of, and do not cover all embodiments of the present disclosure. All other embodiments, which is obtained by a person having ordinary skills in the art based on the embodiments described in the present disclosure without exercising any inventive skill, fall into the protection scope of the present disclosure.

It shall be noted that, all terms (including technical and scientific terms) used in the embodiments of the present disclosure have the same meanings as those commonly understood by persons having ordinary skills in the art to which this disclosure pertains. It shall be further understood that, terms such as those usually defined in dictionaries shall be construed as having identical meanings as in the context of related technology, and shall not be construed using idealized or extremely formalized senses, unless defined clearly as such here.

Structures involved in the embodiments of the present disclosure usually have a size on the order of micrometer or smaller. For clearness, sizes of the structures in FIG. 1 of the embodiment of the present disclosure are enlarged, and do not represent actual sizes.

Figure 1:
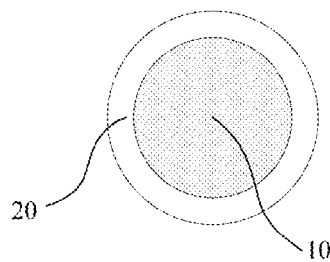
FIG. 1 is a structurally schematic view of a conductive particle provided by an embodiment of the present disclosure.
Figure 2:
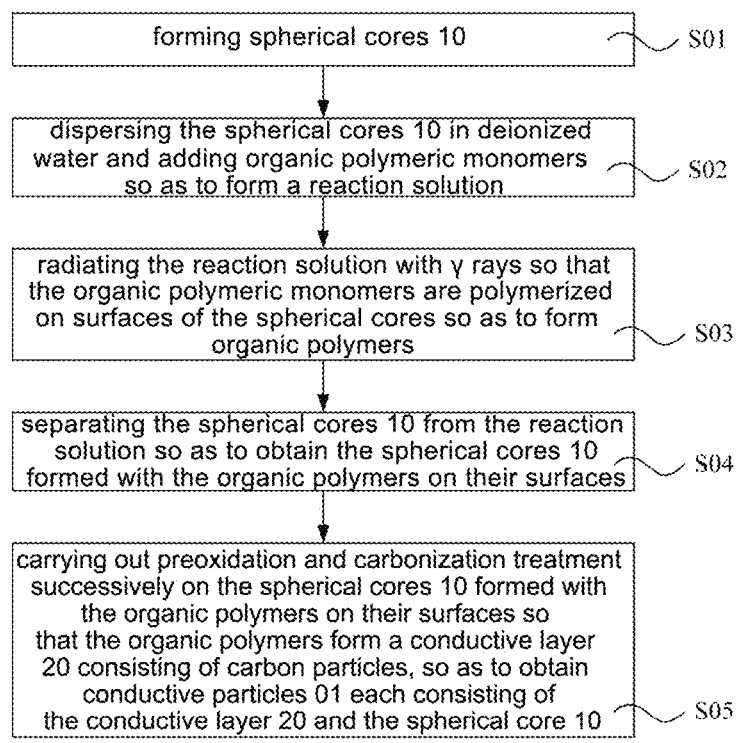
FIG. 2 is a flow diagram of a preparation method of a conductive particle provided by an embodiment of the present disclosure.

According to an embodiment of the present disclosure, the present disclosure provides a method of preparing a conductive particle 01 as shown in FIG. 1. As shown in FIG. 2, the preparation method comprises steps of:

S01: forming spherical cores 10;

S02: dispersing the spherical cores 10 in deionized water and adding organic polymeric monomers so as to form a reaction solution;

S03: radiating the reaction solution with γ rays so that the organic polymeric monomers are polymerized on surfaces of the spherical cores so as to form organic polymers;

S04: separating the spherical cores 10 from the reaction solution so as to obtain the spherical cores 10 formed with the organic polymers on their surfaces;

S05: carrying out preoxidation and carbonization treatment successively on the spherical cores 10 formed with the organic polymers on their surfaces so that the organic polymers form a conductive layer 20 consisting of carbon particles, so as to obtain conductive particles 01 each consisting of the conductive layer 20 and the spherical core 10.

It shall be noted that, the formed conductive particle 01 is represented by "the spherical cores@the conductive layer" hereinafter, wherein the substance before the sign "@" represents the material of the inner core constituting the composite core-shell structure, and the substance after the sign "@" represents the material of the shell layer constituting the composite core-shell structure.

In step S01, the spherical cores 10 are formed using any of various nucleation methods such as a sol-gel process, a process of emulsion polymerization, a microemulsion process, a hydrothermal process, and a microwave hydrothermal process.

The formed spherical core 10 can be made of any of silica ($SiO_2$), aluminum oxide ($Al_2O_3$), polystyrene (PS) and resin so long as it can enable organic polymeric monomers to form organic polymers on its surface by radiation polymerization, and act as a carrier for the organic polymers.

As conductive fillers applied in the conductive adhesive, a part of the conductive particles 01 may comprise the spherical cores made of silica for example, and the other part of the conductive particles 01 may comprise the spherical cores made of PS for examples.

In step S02, the organic polymeric monomer can be selected from acrylonitrile (AN)-based monomers having a high reaction activity and a relatively low price, such as 2,3-dimethyl acrylonitrile, 3-phenyl-2-acrylonitrile, 2-methoxymethyl-3-methoxy acrylonitrile, etc.

When a mass ratio of the organic polymeric monomers with respect to the spherical cores 10 is too small, it will easily cause the subsequently-formed conductive layer 20 to be too thin or coat unevenly, thereby affecting the overall conductivity of the conductive particles 01. When the mass ratio of the organic polymeric monomers with respect to the spherical cores 10 is too large, this will readily lead to aggregation of the carbon particles in the conductive layer 20, and also limited improvement in the overall conductivity of the conductive particles 01. Thus the mass ratio of the organic polymeric monomers to the spherical cores 10 may range from 0.25:1 to 8:1.

For further considering that the aggregation of the organic polymeric monomers on the surface of the spherical cores 10 and the coverage on the surfaces of the spherical cores 10, the mass ratio of the organic polymeric monomers and the spherical cores 10 may range from 0.5:1 to 2:1.

In step S03, the principle based on which the organic polymeric monomers are polymerized by radiation with γ rays on the surfaces of the spherical cores 10 is as follows.

After the spherical cores 10 are dispersed in the deionized water (pure water obtained after impurities in the form of ions have been removed) and the organic polymeric monomers are added thereto to form a reaction solution, water molecules are decomposed under the action of the γ-ray radiation to form $e_{ap}^-$, and radicals H. and .OH. These radicals have small volumes and move fast, and thus enter into the inside of the organic polymeric monomers more easily to initiate the nucleation and induce polymerization of the organic polymeric monomers. Moreover, since the γ rays carrying high energy may further interact with other components in the reaction solution system, for example, the organic polymeric monomers, to generate radicals. Thus there will be more active radicals in the reaction solution system, which will result in improvement in the efficiency of nucleation of the organic polymers and no need to further add an initiator to the reaction solution system.

The radiation source for providing γ rays may be, for example, a Co-60 γ-ray source ($^{60}$Co, its radioactivity may be $1.30 \times 10^{15}$ Bq, wherein Bq is a unit of the radioactivity, Curie) or electron beam accelerator (energy may be 14 KW).

Currently, preoxidization and carbonization treatments are necessary processes in preparing carbon-based materials using organics.

In order to allow the organic polymers after the carbonization treatment to keep a certain structure, the organic polymers must be preoxidized to promote the conversion of the linear molecular chain into a heat-resistant three-dimensional cross-linking structure, i.e., to form a spatial structure, thereby taking the effect of fixing oxygen and carbon so as to prevent the linear molecules from pyrolysis and thus prevent breakage of the main chain. If the organic polymers are directly carbonized without being subjected to preoxidization, they will form resin carbon due to chain breakage caused by pyrolysis, and thus affect the conductivity and stability of the conductive layer 20.

The subsequent carbonization process refers to the transformation of the organic polymers having three-dimensional cross-linking structure obtained after the preoxidization into a conductive carbon-based material such as carbon black, graphite, graphene, and carbon nanotubes, using a high-temperature treatment.

Carrying out the preoxidization and carbonization treatment on the organic polymers in the step S05 may comprise the following steps:

S51: placing the spherical cores 10 formed with the organic polymers on their surfaces in a heating vessel, and heating the spherical cores 10 formed with the organic polymers on their surfaces in the presence of air so as to preoxidize the organic polymers;

S52: introducing an inert gas (such as argon gas, Ar) into the heating vessel and heating the spherical cores 10 formed with the organic polymers on their surfaces so as to carbonize the organic polymers; and S53: after the heating vessel has cooled down, obtaining the conductive particles 01 each consisting of the conductive layer 20 and the spherical core 10 coated with the conductive layer 20.

It shall be noted that, the embodiments of the present disclosure do not set any limit to the parameters such as the temperature-raising rate, heating temperature, temperatureholding time, etc involved in the steps S51-S53, and these parameters can be flexibly adjusted according to the thickness, conductivity and other factors of the conductive layer 20 which is required to be obtained.

In the conductive particle 01 obtained using the preparation method according to the embodiment of the present disclosure and having the above-mentioned spherical cores@the conductive layer composite structure, the conductive layer 20 coating on the surface of the spherical cores 10 is obtained by forming uniformly-distributed organic polymers on the surface of the spherical cores through polymerization with γ-ray radiation and then carrying out the preoxidization and carbonization treatment. Carbon particles constituting the conductive layer 20 are not obtained by direct dispersion of the carbon-based material. The carbon particles are distributed uniformly in the conductive layer 20 and have a large specific surface area, which overcomes the defects in the prior art that the carbon-based materials as conductive fillers are hard to be uniformly crushed and dispersed. Moreover, the conductive layer 20 is obtained by preoxidization and carbonization of the organic polymers, which facilitates the improvement and stabilization of the electrical conductivity of the carbon particles, and thus solves the problems existing in the traditional methods that processing is difficult with the carbon-based material as filler and conductivity varies greatly with producing areas of raw materials and other factors.

The carbon particles adopt the spherical cores 10 as a carrier, which is beneficial to improving dispersibility of the conductive particles 01 in the mainbody glue material of the conductive adhesive and avoids the aggregation existing in the prior art which easily occurs when the carbon-based materials are directly dispersed in the mainbody glue material.

Further, when the spherical cores 10 are made of silica, since silica is an inorganic material and the organic polymeric monomers are organic materials, it is difficult to make them miscible using a traditional process of polymerization, and the organic polymeric monomers can hardly be polymerized on the surfaces of the spherical cores 10. But in the embodiments of the present disclosure, use of γ-ray-radiation polymerization enables formation of uniformly-distributed organic polymers on the surface of the silica spherical cores 10, and there is no need to carry out a complicated surface silylation modification treatment on the spherical cores. Thus the process efficiency is improved, the preparation method is simple and the repeatability is high.

Figure 3:
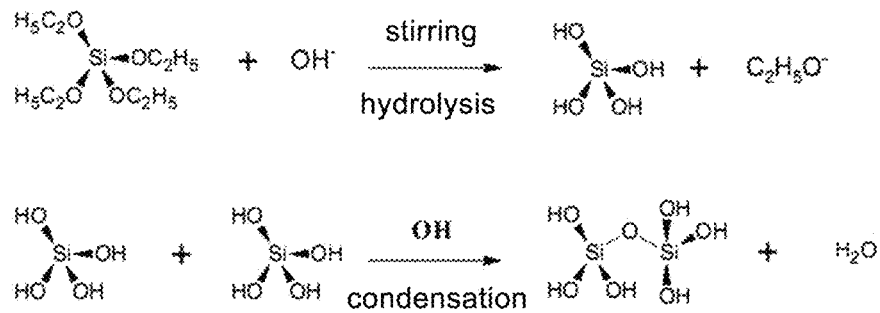
FIG. 3 is a reaction equation of forming a silica spherical core by a sol-gel process.
Figure 10:
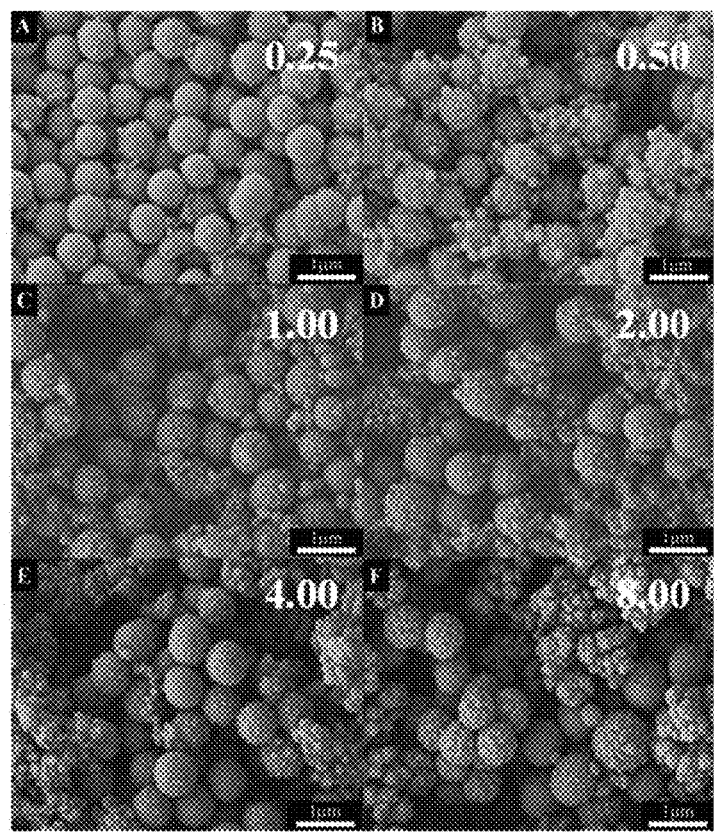
FIG. 10 shows comparison of SEM images of $SiO_2$@PAN composite microspheres obtained with the ratios of AN to $SiO_2$ shown in FIG. 9.

The spherical cores made of silica can be formed using the sol-gel process, and the step S01 may comprise the following steps:

S11a: adding aqueous ammonia to a mixed solution of ethanol and water so as to form an original reaction solution;

S12a: adding tetraethylorthosilicate (TEOS) to the original reaction solution, which then reacts (as shown in FIG. 3) in the presence of aqueous ammonia as a catalyst to form silica spherical cores 10; wherein there are hydroxyl groups —OH on the surface of the silica spherical cores 10, which is conducive to the nucleation of the organic polymers during the subsequent γ-ray radiation polymerization.

S13a: subjecting the formed silica spherical cores 10 to separating, washing and drying treatments successively.

After obtaining the silica spherical cores 10 using the steps S11a-S13a, $SiO_2$@C composite microspheres can be obtained through the subsequent steps S02 to S05.

It shall be noted that, the embodiments of the present disclosure do not set any limit to parameters such as proportions of the raw materials and the reaction time involved in the SG process, and these parameters can be flexibly adjusted according to factors such as the size of the silica spherical core 10 that is required to be obtained.

The sol-gel process ("SG" for short) is a method of preparing a material under mild conditions, in which inorganics or metal alkoxides are usually used as a precursor. In this process, raw materials are mixed well in a liquid phase and then hydrolyzed and condensed to form a stable transparent sol system in the solution. The sol is subjected to aging so that colloidal particles are gradually polymerized to form gel having a three-dimensional network structure where mobility-lost solvents are fully filled. The gel is dried and sintered to form a material having a molecular-scale and even nano-scale substructure.

The precursor of the SG process is TEOS having a relatively low price, which is conducive to further reduction in the cost of the conductive filler (the conductive particles provided in the embodiment of the present disclosure) in the conductive adhesive. Moreover, the SG process allows to achieve uniformity in the molecular level within a relatively short reaction time, and is conductive to the improvement in the uniformity of sizes of the prepared silica spherical cores 10. Also, the reaction conditions are mild, and the repeatability is relatively high.

Alternatively, the spherical cores made of PS can be also formed using a process of emulsion polymerization, which comprises the following steps.

S11b: adding a mixed solution of acrylic acid, styrene and deionized water to a reaction vessel (for example, a four-necked flask installed with a reflux condenser tube, a thermometer and a stirrer) and stirring under the introduction of a nitrogen gas for a period of time (such as 30 minutes).

S12b: adding an amount of KPS (potassium persulfate) as a reaction initiator, and reacting for a period of time at a temperature under the protection of nitrogen gas (for example, the reaction may proceed for 20 hours in a water bath at 70 degree Celsius) so as to form PS spherical cores 10, and maintaining a stirring rate so as to form an emulsion system, wherein the stirring rate may be 300 rpm, for example.

S13b: subjecting the formed PS spherical cores 10 successively to separating, washing and drying treatments.

After obtaining the PS spherical cores 10 using the steps S11b-S13b, PS@C composite microspheres may be obtained through subsequent steps S02 to S05.

It shall be noted that, ratios of the reactants are shown in FIG. 4, and can be flexibly adjusted according to the size, etc. of the PS spherical cores that are required to be obtained, and the embodiments of the present disclosure do not set any limit to them.

A microemulsion is usually composed of a surfactant (also including co-surfactant) and two immiscible solvents. In the microemulsion system, the two immiscible continuous media are partitioned into tiny spaces by the surfactant amphiphilic molecules so as to form size-controllable microreactors, and reactants (i.e., acrylic acid and styrene in the embodiments of the present disclosure) react to form solid-phase particles (i.e., PS spherical cores in the embodiment of the present disclosure) in the microemulsion system. The emulsifier-free emulsion polymerization allows accurate control of the particle size and stability of the prepared nano material, and realization of particles having a size on the order of micrometer or smaller.

Alternatively, prior to the step S03, the preparation method further comprises: introducing a nitrogen gas into the reaction solution so as to remove dissolved oxygen from the reaction solution.

Since water molecules will generate radicals under the radiation with γ rays to promote the polymerization of the organic polymeric monomers, but the radicals will be quenched when encountering oxygen, introduction of a nitrogen gas into the reaction solution may result in reduction of the dissolved oxygen in the reaction system and improvement in the efficiency of conversion of the organic polymeric monomers into the organic polymers and thus increase in the conductivity of the carbon particles. Moreover, nitrogen gas will not react with γ rays as compared with other gas.

According to another aspect of the present disclosure, the present disclosure further provides a conductive particle 01 as shown in FIG. 1, which comprises a conductive layer 20 made of carbon particles and spherical cores 10 coated with the conductive layer 20.

Alternatively, the spherical cores 10 can be made of one or more of silica, aluminum oxide, polystyrene and resin.

The carbon particles constituting the conductive layer 20 comprise one or more of carbon black, graphite, graphene, and nanotubes.

The conductive particles 01 as a conductive filler in the conductive adhesive are required to be uniformly dispersed in the mainbody glue material so as to form the conductive adhesive. When the conductive particles 01 have a too large particle size, it will not be conducive to their uniform dispersion in the mainbody glue material. When the conductive particles 01 have a too small particle size, it will readily aggregate and thus affect the uniformity of the conductivity of the conductive adhesive. Thus the particle size of the conductive particles 01 provided by the embodiment of the present disclosure may range from 0.5 to 1.0 micrometer.

Since the particle size of the conductive particle 01 is a sum of the particle size of the spherical core 10 and the average thickness of the conductive layer 20, the particle size of the spherical core 10 and the average thickness of the conductive layer 20 can be flexibly adjusted through adjusting parameters in the preparation process (such as the reaction time, concentrations of reactants, etc.), thereby adjusting the particle size of the conductive particle 01. No limit to the specific values of them is set here.

According to further another aspect of the present disclosure, the present disclosure further provides a conductive adhesive which comprises a mainbody glue material and the conductive particle 01 as described above.

Alternatively, the mainbody glue material can be made of epoxy resin, acrylic resin or the like. The specific composition and proportions of the components can refer to the prior art, and no limit to them is set here.

According to further another aspect of the present disclosure, the present disclosure further provides a display device which comprises the conductive adhesive as described above for connecting conductive structures.

For example, a pixel electrode or common electrode in the display device, or an anode in an OLED (organic light-emitting display) is usually made of ITO, and the conductive structure may be a ITO external lead electrode for transmitting a signal to the ITO electrode, and since the ITO material cannot be used for soldering, it is possible to connect the ITO external lead electrode with the wiring board for providing a signal through the conductive adhesive according to the embodiment of the present disclosure, and thereby achieve the provision of the respective signal to the ITO electrode.

The above-mentioned display device may be a liquid crystal panel, a liquid crystal display, a liquid crystal television, an OLED (Organic Light-Emitting Display) panel, an OLED display, an OLED television, electronic paper, a digital photo frame, a mobile phone, a tablet computer, and any other product or component that has a display function.

One specific example will be provided below for describing in detail the preparation method and performance of the obtained conductive particles 01 as described above.

EXAMPLE

1. The Preparation Method of the Conductive Particles
Step S101

15.0 mL aqueous ammonia is added to a mixed system of ethanol/deionized water, and 8.0 mL TEOS is added to react for 14 to 16 hours under magnetic stirring (the stirring rate is 300 rpm). The equation of the chemical reaction that the TEOS occurs in the presence of aqueous ammonia as a catalyst is shown in FIG. 3. The amounts of ethanol and deionized water are 125 mL and 50 mL, respectively.

The prepared silica spherical cores 10 are extracted by centrifugation at 5000 rpm for 5 minutes and washing with ethanol. Then, the silica spherical cores 10 are dried at 50 degree Celsius for 24 hours.

Step S102

The centrifuged and dried silica spherical cores 10 is dispersed uniformly in deionized water by ultrasonic wave, and an appropriate amount of acrylonitrile-based organic polymeric monomers (hereinafter referred to as AN monomers) is added to the dispersed system of silica spherical cores 10. After well stirring for five minutes, a nitrogen gas is introduced to drive out dissolved oxygen in the system.

Step S103

The sealed reaction system is placed in radiation areas of the radiation source radiating $^{60}Co$ γ rays whose radioactivity is $1.30 \times 10^{15}$Bq for 12 hours under a room temperature condition so that PAN (polyacrylonitrile) is formed on the surfaces of the silica spherical cores 10 so as to obtain $SiO_2$@PAN composite microspheres.

It shall be noted that, the "room temperature condition" is also called a normal temperature or a general temperature, and in general, the room temperature has three defined ranges: (1) 23° C.±2° C.; (2) 25° C.±5° C.; or (3) 20° C.±5° C.

Step S104

The radiated product $SiO_2$@PAN composite microspheres are separated by centrifugation, and then is washed for use.

Step S105

A certain mass of $SiO_2$@PAN composite microspheres is placed in a quartz tank of a horizontal tube furnace, and subjected to preoxidation and carbonization treatments successively.

In order to prevent pyrolysis of PAN due to a fast temperature-raising rate during preoxidization, the preoxidization comprises two temperature-raising steps: raising the temperature from a room temperature to 230 degree Celsius at a raising rate of 5 degree Celsius per minute under the introduction of air (the flow rate of air is 120 mL/min); and then raising from 230 degree Celsius to 270 degree Celsius at 1 degree Celsius per minute and maintaining at 270 degree Celsius for 1 to 2 hours.

The carbonization treatment comprises: introducing Ar into the horizontal tube furnace so as to remove residue air in the furnace, and raising the temperature from 270 degree Celsius to 600 degree Celsius at a raising rate of 4 degree Celsius per minute and maintaining for 30 minutes at the temperature; and then raising to 1150 degree Celsius at 10 degree Celsius per minute and maintaining for 1 to 2 hours at the temperature.

After the completion of the carbonization treatment, when the temperature of the tube furnace is reduced to 50 degree Celsius or below, the sample will be taken out from the furnace for performance testing.

2. Testing Method and Testing Performance 2.1 Testing the $SiO_2$@PAN Composite Microspheres Prior to the Above Step S105.

(1) As shown in FIG. 5, a comparison testing of FTIR spectra is performed on the $SiO_2$@PAN composite microspheres, $SiO_2$ spherical core and PAN. It can be seen from the comparison of FTIR spectra that the prepared $SiO_2$@PAN composite microspheres have typical characteristic peaks corresponding to those of the PAN: 1101 $cm^{-1}$, 945 $cm^{-1}$, 798 $cm^{-1}$ and 466 $cm^{-1}$. This may prove that the formed $SiO_2$@PAN composite microspheres are covered with PAN polymer particles on their surfaces.

(2) As shown in FIG. 6, SEM images of the formed $SiO_2$@PAN composite microspheres and $SiO_2$ spherical cores are compared and analyzed. In FIG. 6, A and A1 are SEM images of $SiO_2$ spherical cores under different magnifications, and B and B1 and the magnified part in B1 are SEM images of $SiO_2$@PAN composite microspheres under different magnifications. As can be intuitively observed from B, B1 and the magnified part in B1, the $SiO_2$ spherical cores are formed with PAN polymer particles on their surfaces as compared with the SEM images of the $SiO_2$ spherical cores.

(3) As shown in FIG. 7, elemental contents of the $SiO_2$@PAN composite microspheres are more accurately measured through XPS. The XPS spectrum indicates there is 44.82% carbon, and also 13.5% nitrogen on the surface of the $SiO_2$@PAN composite microsphere because an amount of nitrogen gas has been introduced prior to the radiation with γ rays of $^{60}Co$ into the dispersed system of $SiO_2$ spherical cores 10 to drive out the dissolved oxygen.

(4) As shown in FIG. 8, Thermo Gravimetric Analysis (TGA) is performed on the formed $SiO_2$@PAN composite microspheres, $SiO_2$ spherical cores and PAN. TGA shows that the amount of polyacrylonitrile on the surfaces of the $SiO_2$@PAN composite microspheres is greater than 75%. Therefore, after the subsequent preoxidization and carbonization treatment, a conductive layer 20 having a certain thickness and consisting of carbon particles can be obtained.

(5) Using the ratios of AN/$SiO_2$ as shown in FIG. 9, six groups of samples (numbers: A to F) are obtained. As can be seen from the comparison and analysis of SEM images of these six groups of samples, when the mass ratio of AN/$SiO_2$ is 0.25:1, there is only a small amount of PAN particles on the surfaces of the formed $SiO_2$ spherical cores, and the coating effect of the PAN particles on the $SiO_2$ spherical cores is poor, which is not good for the subsequent formation of carbon particle conductive layer; with the increase in the mass ratio of AN/$SiO_2$, the amount of PAN particles coating on the formed $SiO_2$ spherical cores gradually increases, and when the mass ratio of AN/$SiO_2$ increases gradually from 4:1 to 8:1, a certain degree of aggregation of PAN particles coating on the surfaces of the $SiO_2$ spherical cores occurs, which is not good for the uniform dispersion of carbon particles in the subsequently-formed conductive layer. Therefore, taking both the aggregation of PAN and the coverage on the $SiO_2$ spherical cores into account, the mass ratio of AN/$SiO_2$ preferably ranges from 0.5:1 to 2:1.

2.2 Testing the $SiO_2$@C Composite Microspheres after the Step S105

Figure 11:
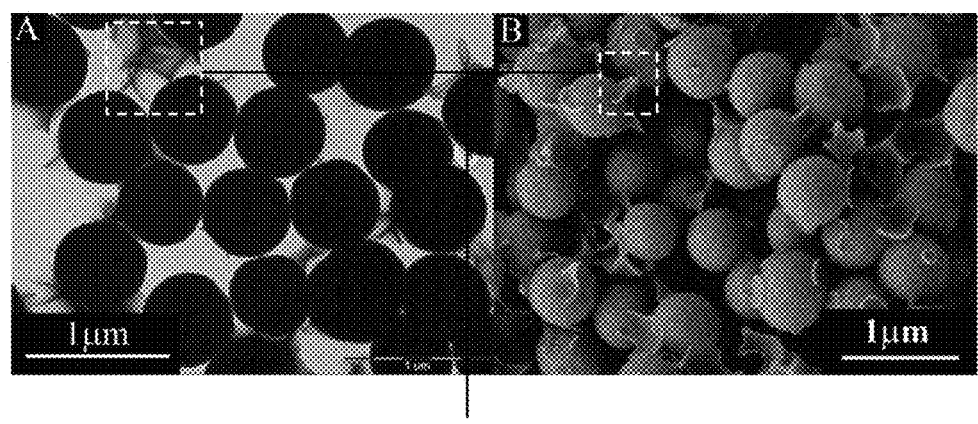
FIG. 11 shows TEM and SEM images of $SiO_2$@C composite microspheres obtained with a mass ratio of AN to $SiO_2$ of 0.5:1.
Figure 12:
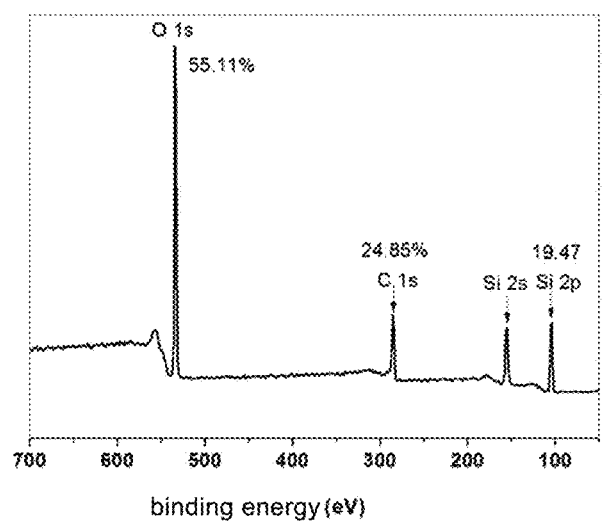
FIG. 12 is a XPS spectrogram of $SiO_2$@C composite microspheres obtained with a mass ratio of AN to $SiO_2$ of 0.5:1.

As shown in FIG. 11, the $SiO_2$@C composite microspheres formed using a mass ratio of AN/$SiO_2$ of 0.5:1 are analyzed based their TEM and SEM images. In FIG. 11, A is the TEM image of the $SiO_2$@C composite microspheres, and B is the SEM image of the $SiO_2$@C composite microspheres. As can be seen from A and B, a layer of carbon particles is coated on the surfaces of the $SiO_2$ spherical cores.

In order to better prove that the material coating on the surfaces of the $SiO_2$ spherical cores is carbon particles, the $SiO_2$@C composite microspheres are further tested by XPS. It can be seen from the XPS spectrum that there is 24.82% C on the surface of the formed $SiO_2$@C composite microspheres.

It shall be noted that, a person skilled in the art shall understand that the structures schematically shown in the drawings do not constitute limitations to the specific structural composition of the conductive particle provided in the embodiments of the present disclosure, and are merely for clearly describing structures related to inventive points of the present disclosure, and the other structures that are irrelevant to the inventive points of the present disclosure are prior structures, and are not reflected or merely partially reflected in the drawings.

The forgoing are merely particular embodiments of the present disclosure, but the protection scope of the present disclosure is not limited thereto. Any person skilled in the art and familiar with this art can readily envisage variations or replacements within the scope of technologies disclosed in the present disclosure, all of which fall within the protection scope of the present disclosure. Therefore, the protection scope of the present disclosure shall be determined by the terms of the claims.

What is claimed is:

1. A method of preparing conductive particles, comprising the steps of:
    forming spherical cores comprising silica;
    dispersing the spherical cores in deionized water and adding organic polymeric monomers so as to form a reaction solution, wherein the organic polymeric monomer is one or more selected from the group consisting of acrylonitrile, 2,3-dimethyl acrylonitrile, 3-phenyl-2-acrylonitrile, and 2-methoxymethyl-3-methoxy acrylonitrile, and a mass ratio of the organic polymeric monomers to the spherical cores ranges from 0.5:1 to 2:1;
    radiating the reaction solution with γ rays so that the organic polymeric monomers are polymerized on surfaces of the spherical cores so as to form organic polymers;
    separating the spherical cores from the reaction solution so as to obtain the spherical cores formed with the organic polymers on their surface; and
    carrying out preoxidation and carbonization treatment successively on the spherical cores formed with the organic polymers on their surfaces so that the organic polymers form a conductive layer consisting of carbon particles, thereby obtaining the conductive particles each consisting of the conductive layer and the spherical core.

2. The method according to claim 1, wherein the step of forming spherical cores comprises forming the spherical cores using one or more selected from the group consisting of a sol-gel process, a process of emulsion polymerization, a microemulsion process, a hydrothermal process, and a microwave hydrothermal process.

3. The method according to claim 2, wherein silica spherical cores are formed through the sol-gel process, and the step of forming silica spherical cores through the sol-gel process comprises:
　　adding aqueous ammonia to a mixed solution of ethanol and water so as to form an original reaction solution;
　　adding tetraethylorthosilicate to the original reaction solution to carry out a reaction so as to form silica spherical cores; and
　　subjecting the formed silica spherical cores to separating, washing and drying treatments successively.

4. The method according to claim 1, wherein, prior to the step of radiating the reaction solution with γ rays, the method further comprises:
　　introducing a nitrogen gas into the reaction solution so as to remove dissolved oxygen from the reaction solution.

5. The method according to claim 1, wherein the step of carrying out preoxidation and carbonization treatment successively on the spherical cores formed with the organic polymers on their surfaces comprises:
　　placing the spherical cores formed with the organic polymers on their surfaces in a heating vessel, and heating the spherical cores formed with the organic polymers on their surfaces in the presence of air so as to preoxidize the organic polymers;
　　introducing an inert gas into the heating vessel and heating the spherical cores formed with the organic polymers on their surfaces so as to carbonize the organic polymers; and
　　after the heating vessel has been cooled down, obtaining the conductive particles each consisting of the conductive layer and the spherical core.

\* \* \* \* \*